US009305969B2

(12) United States Patent
Suyama et al.

(10) Patent No.: US 9,305,969 B2
(45) Date of Patent: Apr. 5, 2016

(54) SOLID-STATE IMAGING DEVICE OPERABLE WITH TWO READOUT MODES IN TWO DIFFERENT DIRECTIONS COINCIDENT WITH A MOVING SPEED AND A MOVING DIRECTION OF A MOVING SUBJECT

(71) Applicant: HAMAMATSU PHOTONICS K.K., Hamamatsu-shi, Shizuoka (JP)

(72) Inventors: Motohiro Suyama, Hamamatsu (JP); Akiomi Ujima, Hamamatsu (JP); Kentaro Maeta, Hamamatsu (JP); Hisanori Suzuki, Hamamatsu (JP); Masaharu Muramatsu, Hamamatsu (JP); Fumio Iwase, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 491 days.

(21) Appl. No.: 13/666,098

(22) Filed: Nov. 1, 2012

(65) Prior Publication Data

US 2013/0112853 A1    May 9, 2013

(30) Foreign Application Priority Data

Nov. 2, 2011  (JP) .................................. 2011-241343

(51) Int. Cl.
*G06M 7/00*    (2006.01)
*H01L 27/00*    (2006.01)
(Continued)

(52) U.S. Cl.
CPC ........ *H01L 27/14843* (2013.01); *H04N 3/1525* (2013.01); *H04N 3/1537* (2013.01); *H04N 5/3722* (2013.01)

(58) Field of Classification Search
CPC ......... H04N 5/32; H04N 5/372; H04N 5/378; H04N 3/1575; H04N 3/1537; H04N 5/335; H04N 3/1525; H01L 27/14843; H01L 27/14831; H01L 27/148; H01L 27/14638; H01L 27/14634
USPC ................ 250/208.1, 214 R, 214 A, 214 DC; 348/311, 302, 308, 294, 298, 299, 303, 348/316, 319; 257/258, 257, 291, 292, 293, 257/290, 685, 684
See application file for complete search history.

(56) References Cited

U.S. PATENT DOCUMENTS 5,848,123 A * 12/1998 Strommer .................... 378/98.8
6,005,617 A * 12/1999 Shimamoto et al. .......... 348/295
(Continued)

FOREIGN PATENT DOCUMENTS

JP    6-196680    7/1994
JP    2002-135656    5/2002
(Continued)

*Primary Examiner* — Que T Le
*Assistant Examiner* — Jennifer Bennett
(74) *Attorney, Agent, or Firm* — Drinker Biddle & Reath LLP

(57) ABSTRACT

A solid-state imaging device 1A includes a CCD-type solid-state imaging element 10 having an imaging plane 12 formed of M×N pixels that are two-dimensionally arrayed in M rows and N columns, N signal readout circuits 20 arranged on one end side in the column direction for each of the columns with respect to the imaging plane 12, and N signal readout circuits 30 arranged on the other end side in the column direction for each of the columns with respect to the imaging plane 12, a semiconductor element 50 for digital-converting and then sequentially outputting as serial signals electrical signals output from the signal readout circuits 20 for each of the columns, and a semiconductor element 60 for digital-converting and then sequentially outputting as serial signals electrical signals output from the signal readout circuits 30 for each of the columns.

3 Claims, 9 Drawing Sheets

(51) Int. Cl.
*H01L 27/148* (2006.01)
*H04N 5/3722* (2011.01)
*H04N 3/14* (2006.01)

(56) References Cited

U.S. PATENT DOCUMENTS

| | | | |
|---|---|---|---|
| 7,796,174 B1 * | 9/2010 | Harwit et al. | 348/311 |
| 8,294,073 B1 * | 10/2012 | Vance et al. | 250/203.1 |
| 2002/0020801 A1 * | 2/2002 | Wadsworth et al. | 250/208.1 |
| 2009/0213248 A1 * | 8/2009 | Chan | 348/241 |

FOREIGN PATENT DOCUMENTS

| | | |
|---|---|---|
| JP | 2003-152952 | 5/2003 |
| JP | 3441101 | 8/2003 |
| JP | 2007-19664 | 1/2007 |
| JP | 4098852 | 6/2008 |
| JP | 4173575 | 10/2008 |
| JP | 2010-245103 | 10/2010 |
| WO | 2008/142968 | 11/2008 |

* cited by examiner

SOLID-STATE IMAGING DEVICE OPERABLE WITH TWO READOUT MODES IN TWO DIFFERENT DIRECTIONS COINCIDENT WITH A MOVING SPEED AND A MOVING DIRECTION OF A MOVING SUBJECT

BACKGROUND OF THE INVENTION

1. Field of the Invention

The present invention relates to a solid-state imaging device.

2. Related Background Art

Japanese Patent Application Laid-Open No. 2002-135656 discloses a solid-state imaging device including an interline CCD architecture section. This solid-state imaging device includes a plurality of charge detection circuits each for converting a charge output from a charge transfer CCD to a voltage signal and a horizontal scanning circuit for sequentially reading out voltage signals output from these charge detection circuits. The horizontal scanning circuit is formed by a CMOS circuit to perform a high-speed readout operation.

Japanese Patent Application Laid-Open No. 2007-19664 discloses a solid-state imaging device including an interline CCD architecture section. This solid-state imaging device includes a pixel array region for which a plurality of photoelectric conversion units are arrayed into rows and columns, vertical CCDs arranged for each of the columns of the pixel array region, transfer electrodes arranged for each of the rows of the pixel array region, and a vertical drive circuit for driving the transfer electrodes so that charges of the photoelectric conversion units are transferred to the vertical CCD and then the charges are vertically transferred in the vertical CCD. Further, at the most downstream side (destination to which a charge is vertically transferred) of each vertical CCD, a circuit for converting a signal charge that has arrived being vertically transferred by the vertical CCD into a voltage signal and a readout circuit for amplifying and holding the voltage signal are provided. The readout circuit is formed by a CMOS circuit, and has amplifier circuits of a number corresponding to the number of columns of the pixel array region and a line memory for holding amplification signals output therefrom.

Japanese Patent Application Laid-Open No. 2003-152952 discloses an image sensor head to be used for reading of an image. This image sensor head includes a CCD sensor and a control circuit. A CCD sensor chip having the CCD sensor and a C-MOS control chip having the control circuit are mounted on a substrate in a separate manner independently of each other. The CCD sensor chip and the C-MOS control chip are directly connected by a plurality of control signal wires of therebetween. There are provided a plurality of CCD sensor chips, and there are provided a plurality of C-MOS control chips corresponding to the CCD sensor chips.

Pamphlet of International Publication No. WO2008/142968 discloses an image sensor head including a CCD sensor chip. The CCD sensor chips includes a plurality of photodiodes each for converting incident light into a charge to thereby generate a signal charge according to the intensity of that light, a plurality of memories for accumulating and storing signal charges generated by those photodiodes, and a register for reading out and transferring signal charges of the plurality of memories. A signal charge generated by the photodiode is sequentially accumulated in memories neighboring a memory while being transferred from the memory. This image sensor head includes a C-MOS control chip separate from the CCD sensor chip, and these chips are mounted on a substrate independently of each other.

Japanese Patent Application Laid-Open No. H06-196680 discloses a semiconductor energy detector including a back incident-type CCD. The CCD detects an energy beam such as short-wavelength light.

Japanese Patent No. 3441101 and Japanese Patent No. 4098852 disclose electron tubes including back incident-type CCDs. The CCDs detect electrons emitted from photoelectric surfaces for converting incident light into electrons.

Japanese Patent No. 4173575 discloses an imaging device. In this imaging device, inside a vacuum vessel, there is a built-in photoelectric surface for emitting photoelectrons from a surface opposite to a light incident surface according to incident light and a built-in back incident-type CCD arranged opposed to the photoelectron emitting surface of the photoelectric surface and for detecting as an image a spatial distribution of photoelectrons by a plurality of pixels.

SUMMARY OF THE INVENTION

Depending on the intended use of a solid-state imaging device, this may image a subject moving at a certain constant speed. In the case of, for example, an inspection of a semiconductor element structure built on a semiconductor wafer, imaging of a minute area (for example, several tens of micrometers on a side) on a 12-inch wafer performed in an enlarged manner results in a significantly large number of times of imaging, and a long time is required for the inspection. Therefore, a so-called TDI (Time Delay Integration) operation, which is for relatively moving a solid-state imaging device with respect to a subject and making the CCD charge transfer speed coincident with that relative speed while performing imaging, is performed. This TDI operation allows imaging a large area subject with a high spatial resolution and in a short time.

However, in the conventional solid-state imaging device, the direction of charge transfer in the CCD is fixed, so that a relative movement between the subject and solid-state imaging device is limited to one direction in a TDI operation. Therefore, for imaging a certain area from its one end to the other end by a TDI operation and then imaging a neighboring area, it becomes necessary to move the solid-state imaging device to one end of that area. This movement prolongs the time required for imaging.

The present invention has been made in view of such problems, and it is an object of the present invention to provide a solid-state imaging device capable of shortening the time required for imaging when performing imaging by a TDI operation.

In order to solve the problems mentioned above, a solid-state imaging device according to an aspect of the present invention includes a CCD-type solid-state imaging element having an imaging plane formed of M×N (M and N are integers not less than 2) pixels that are two-dimensionally arrayed in M rows and N columns, N first signal readout circuits arranged on one end side in the column direction for each of the columns with respect to the imaging plane and for outputting electrical signals according to magnitudes of charges taken out of the respective columns, respectively, and N second signal readout circuits arranged on the other end side in the column direction for each of the columns with respect to the imaging plane and for outputting electrical signals according to magnitudes of charges taken out of the respective columns, respectively, a first semiconductor element for converting electrical signals output from the first signal readout circuits for each of the columns to digital signals, and sequentially outputting the digital signals of the respective columns as serial signals, and a second semiconductor element for converting electrical signals output from the second signal readout circuits for each of the columns to digital signals, and sequentially outputting the digital signals of the respective columns as serial signals.

In this solid-state imaging device, the CCD-type solid-state imaging element has the first and second signal readout circuits arranged at each of one and the other ends in the column direction thereof, and further, to each of these signal readout circuits, each of the first and second semiconductor elements for serial signal outputs is connected. By this solid-state imaging device, output ports (terminal end pixels) of the respective columns of the solid-state imaging element and the first and second signal readout circuits can be arranged close to each other on a common substrate and input ports (input ends) of the signal readout circuits are arranged for each of the columns, so that high-speed and low-noise readout can be realized. Moreover, in the case of performing a TDI operation in a direction from the other end side to one end side, it suffices to transfer a charge in that direction, and convert the charge into a serial signal output by the first signal readout circuit and the first semiconductor element. Moreover, in the case of performing a TDI operation in a direction from one end side to the other end side, it suffices to transfer a charge in that direction, and convert the charge into a serial signal output by the second signal readout circuit and the second semiconductor element. Thus, by the above-described solid-state imaging device, the CCD charge transfer direction can be reversed. Therefore, when performing imaging by a TDI operation, a movement of the solid-state imaging device can be reduced, so that the time required for imaging can be shortened.

Moreover, the solid-state imaging device may further include a transfer control section for controlling charge transfer in the column direction of the imaging plane, in which the transfer control section may have a first operation mode for transferring a charge in a direction from the other end side to the one end side, and a second operation mode for transferring a charge in a direction from the one end side to the other end side. Accordingly, effects of the solid-state imaging device mentioned above can be favorably obtained. Also, in this case, in order to perform a TDI operation favorably, the transfer control section may make a transfer speed and transfer direction of a charge coincident with a moving speed and moving direction of a moving subject.

Moreover, in the solid-state imaging device, each of the first and second semiconductor elements may include a correlated double sampling circuit for reducing noise of electrical signals output for each of the columns from each of the N first and second signal readout circuits, a buffer for amplifying a signal output from the correlated double sampling circuit, an analog/digital converter circuit for converting a signal output from the buffer to a digital signal, and a multiplexer for sequentially outputting the digital signals of the respective columns output from the analog/digital converter circuit as serial signals.

DESCRIPTION OF THE PREFERRED EMBODIMENTS

Figure 1:
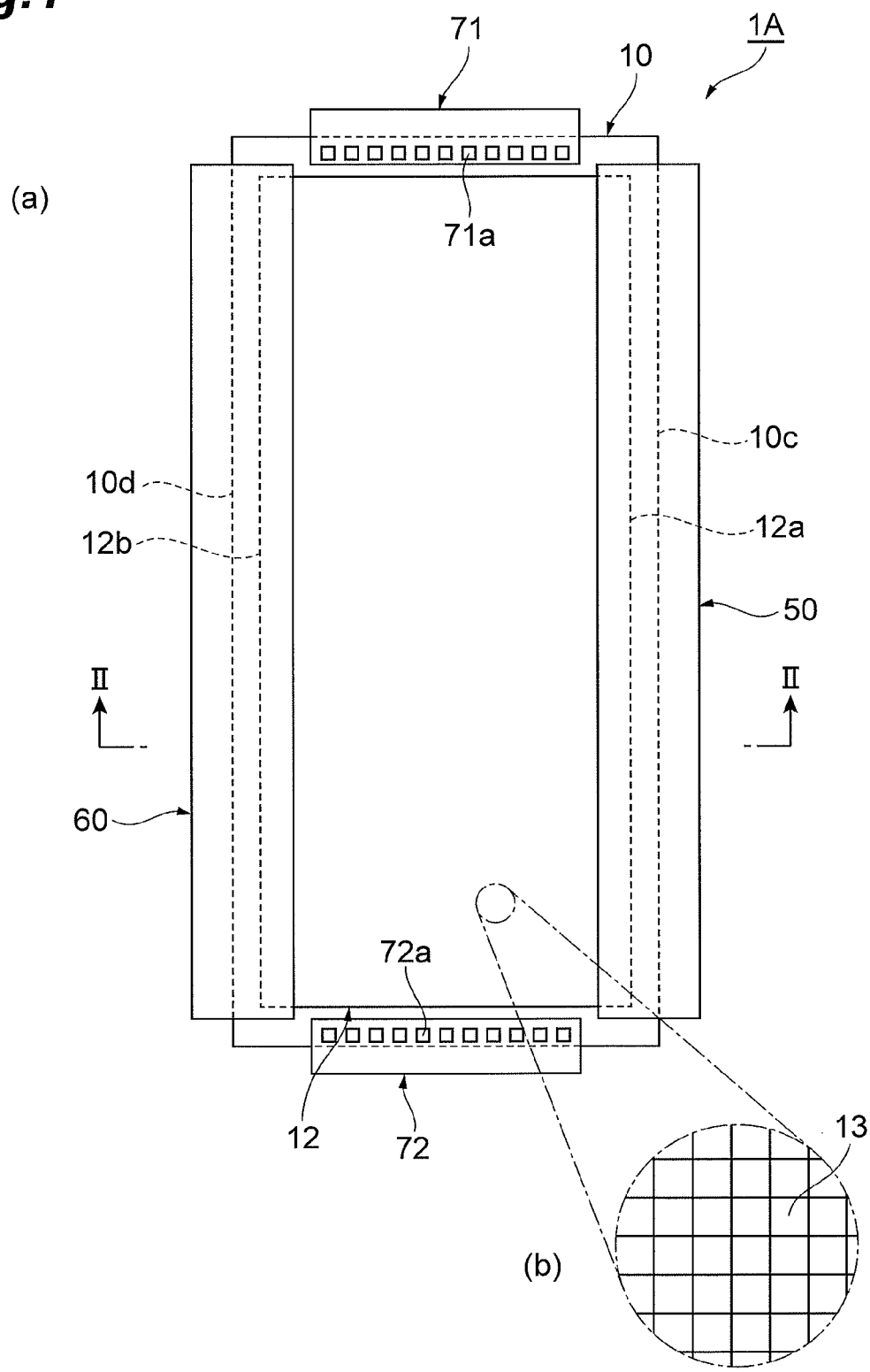
FIG. 1(a) is a plan view showing a configuration of a solid-state imaging device according to an embodiment of the present invention.
FIG. 1(b) is a partially enlarged view of FIG. 1(a).

Hereinafter, embodiments of a solid-state imaging device according to the present invention will be described in detail with reference to the accompanying drawings. Also, the same components will be denoted with the same reference numerals in the description of the drawings, and overlapping description will be omitted.

Figure 2:
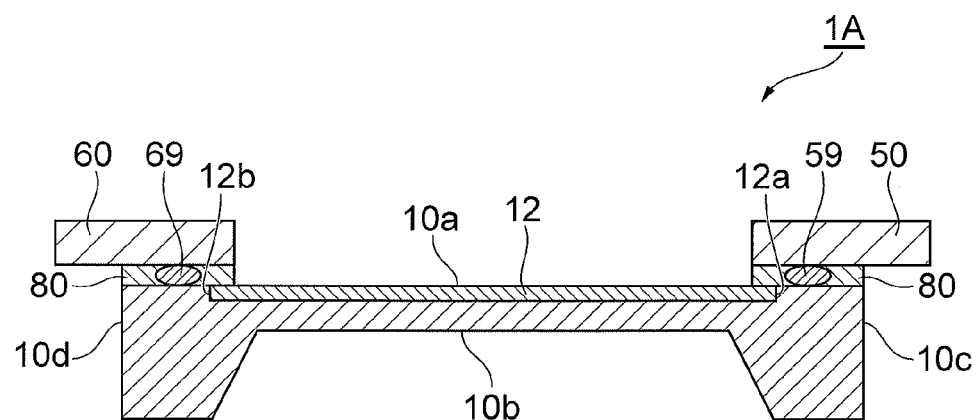
FIG. 2 is a view showing a section taken along a line II-II of the solid-state imaging device shown in FIG. 1.

FIG. 1(a) is a plan view showing a configuration of a solid-state imaging device 1A according to an embodiment of the present invention. FIG. 1(b) is a partially enlarged view of FIG. 1(a). FIG. 2 is a view showing a section taken along a line II-II of the solid-state imaging device 1A shown in FIG. 1. As shown in FIG. 1 and FIG. 2, the solid-state imaging device 1A of the present embodiment includes a solid-state imaging element 10 and two semiconductor elements 50 and 60.

The solid-state imaging element 10 is a device containing charge coupled devices of a so-called CCD (Charge Coupled Device) type, and shows a substrate form having a main surface 10a and a back surface 10b. The solid-state imaging element 10 has an imaging plane 12 and first and second signal readout circuits in the main surface 10a. The imaging plane 12 is formed of M×N (M and N are integers not less than 2) pixels 13 that are two-dimensionally arrayed in M rows and N columns as shown in FIG. 1(b). M is, for example, 512, and N is, for example, 2048. Into the imaging plane 12, detection objects (light such as ultraviolet rays, radiation such as X-rays, or electron beams) are made incident from the back surface 10b side of the solid-state imaging element 10. The imaging plane 12 images any of these detection objects. Also, the back surface 10b is thinned and depressed relative to an edge portion of the solid-state imaging element 10 so that detection objects are sufficiently made incident into the imaging plane 12 on the main surface 10a side. In the respective pixels 13, charges according to the intensities of these detection objects made incident into the imaging plane 12 are generated, and the charges are accumulated. On the respective pixels 13, M transfer electrodes (not shown) for transferring a charge in the column direction are disposed for each of the rows. To the M transfer electrodes, voltage signals (driving voltages) to control charge transfer in the column direction of the imaging plane 12 are supplied.

As shown in FIG. 1, the solid-state imaging device 1A of the present embodiment further includes two drive pad conversion substrates 71, 72. The drive pad conversion substrates 71, 72 are disposed along both end edges of the imaging plane 12 in the row direction, respectively, and fixed to the main surface 10a of the solid-state imaging element 10. The drive pad conversion substrate 71 (72) has at least three driving voltage pads 71a (72a) arrayed along the end edge of the imaging plane 12, and to these driving voltage pads 71a (72a), voltage signals (driving voltages) to control charge transfer are fed. As will be described later, because a signal charge is transferred in either of the A1 direction and A2 direction (first and second operation modes to be described later) of FIG. 3, the CCD of the solid-state imaging element 10 is formed with three phases, and voltages of mutually different phases are applied to these drive voltage pads 71a (72a). Because the electrodes of the respective phases are connected in the solid-state imaging element 10, it suffices to have three driving voltage pads 71a (72a). However, a single phase may be driven by a plurality of (k) amplifiers (drive circuits) in the case of transferring at high speed. In that case, the number of driving voltage pads 71a (72a) is (3×k).

Figure 3:
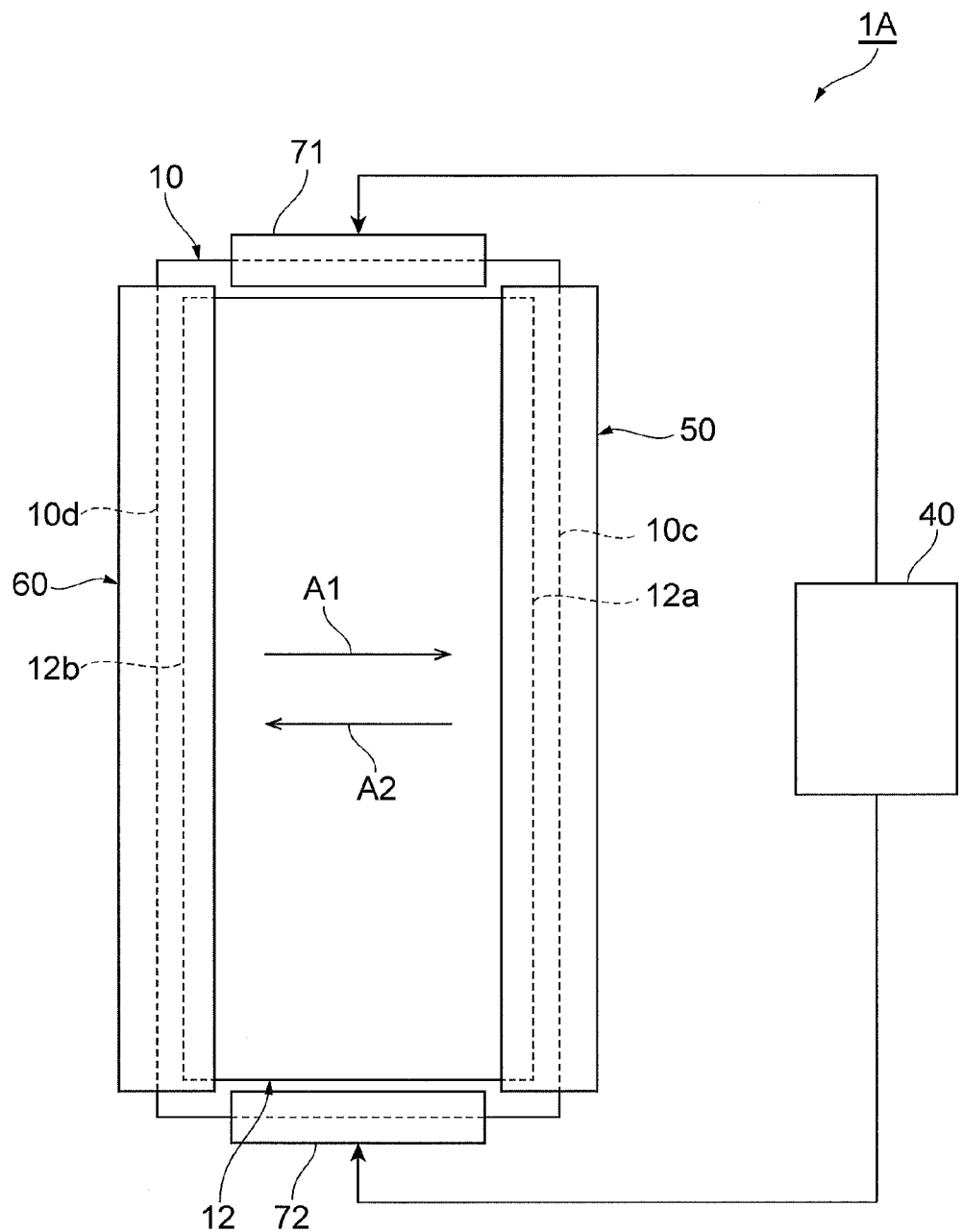
FIG. 3 is a block diagram schematically representing a transfer control section and a solid-state imaging element.

The solid-state imaging device 1A may further include a transfer control section for generating a voltage signal to control charge transfer. FIG. 3 is a block diagram schematically representing the transfer control section 40 and the solid-state imaging element 10. The transfer control section 40 generates three voltage signals to control charge transfer in the column direction, and feeds these voltage signals to the transfer electrodes via the drive pad conversion substrates 71, 72.

The imaging plane 12 has one end 12a and the other end 12b in the column direction. The transfer control section 40 has an operation mode (first operation mode) for transferring a charge in the direction (arrow A1 in the figure) from the other end 12b side to the one end 12a side of the imaging plane 12 in the column direction and an operation mode (second operation mode) for transferring a charge in the direction (arrow A2 in the figure) from the one end 12a side to the other end 12b side. On the other hand, the solid-state imaging element 10 has N signal readout circuits (first signal readout circuits) arrayed along the one end 12a of the imaging plane 12 and N signal readout circuits (second signal readout circuits) arrayed along the other end 12b of the imaging plane 12. In the first operation mode, an electrical signal according to the magnitude of a charge taken out of each column is output from the first signal readout circuit, and in the second operation mode, an electrical signal according to the magnitude of a charge taken out of each column is output from the second signal readout circuit.

The transfer control section 40 of the present embodiment can perform a TDI operation by making the transfer speed and transfer direction of a charge coincident with the moving speed and moving direction of a subject, respectively. That is, by transferring a charge with the same transfer speed as the moving speed of a subject moving in the column direction of the imaging plane 12 and transferring the charge in the first operation mode when the subject moves in the direction of arrow A1 and in the second operation mode when the subject moves in the direction of arrow A2, a charge according to the intensity of detection objects (light such as ultraviolet rays, radiation such as X-rays, or electron beams) at a certain position of the subject can be continuously accumulated in parallel with the transfer operation.

Such a TDI operation will be described by specifically giving a certain single pixel column as an example. Into a pixel in the m-th row included in said pixel column, detection objects are made incident from a certain part of a subject, and a charge is generated. The charge is transferred to a next-stage pixel in the (m+1)-th row, and accumulated in the pixel in the (m+1)-th row. Simultaneously therewith, said part of the subject relatively moves at the same speed as the transfer speed relative to the imaging plane 12. Therefore, detection objects from the same part of the subject are made incident into the pixel in the (m+1)-th row, so that a charge is further generated in the pixel in the (m+1)-th row. Then, the charge accumulated in the pixel in the (m+1)-th row is transferred to a next-stage pixel in the (m+2)-th row. Thereafter, the same operation is repeated in the respective rows, so that a charge according to the intensity of detection objects corresponding to said part of the subject is continuously accumulated over the plurality of rows. Accordingly, a clear image of the moving object can be prepared.

FIG. 1 and FIG. 2 are referred to again. The semiconductor element 50 is a first semiconductor element of the present embodiment. The semiconductor element 50 is mounted on the main surface 10a of the solid-state imaging element 10, along the one end 12a of the imaging plane 12, so as to cover the one end 12a. The semiconductor element 50 has, for example, a C-MOS semiconductor chip, converts electrical signals output from the foregoing first signal readout circuits for each of the columns to digital signals by a circuit built in the semiconductor chip, and sequentially outputs the digital signals of the respective columns to the outside of the solid-state imaging device 1A as serial signals.

The semiconductor element 60 is a second semiconductor element of the present embodiment. The semiconductor element 60 is mounted on the main surface 10a of the solid-state imaging element 10, along the other end 12b of the imaging plane 12, so as to cover the other end 12b. The semiconductor element 60 has, for example, a C-MOS semiconductor chip, converts electrical signals output from the foregoing second signal readout circuits for each of the columns to digital signals by a circuit built in the semiconductor chip, and sequentially outputs the digital signals of the respective columns to the outside of the solid-state imaging device 1A as serial signals.

Generally, because a CCD and a C-MOS are different in process from each other, a C-MOS-type digital conversion circuit and serial conversion circuit cannot be fabricated on the solid-state imaging element 10 that is a CCD type. It is indeed possible to form these circuits by a group of discrete circuit elements and ICs, but the number of columns N exceeding 100 results in a large mounting area, which therefore requires a long wiring of several tens of millimeters to connect the solid-state imaging element 10 and these circuits, so that noise is heavily superimposed and the read-out rate (band) is limited.

As shown in FIG. 2, the semiconductor elements 50 and 60 are bonded to the solid-state imaging element 10 via a conductive material (for example, bump electrodes 59 and 69). An underfill 80 is provided around each of the bump electrodes 59 and 69, and the solid-state imaging element 10 and the semiconductor elements 50 and 60 are more strongly bonded by these underfills 80.

Figure 4:
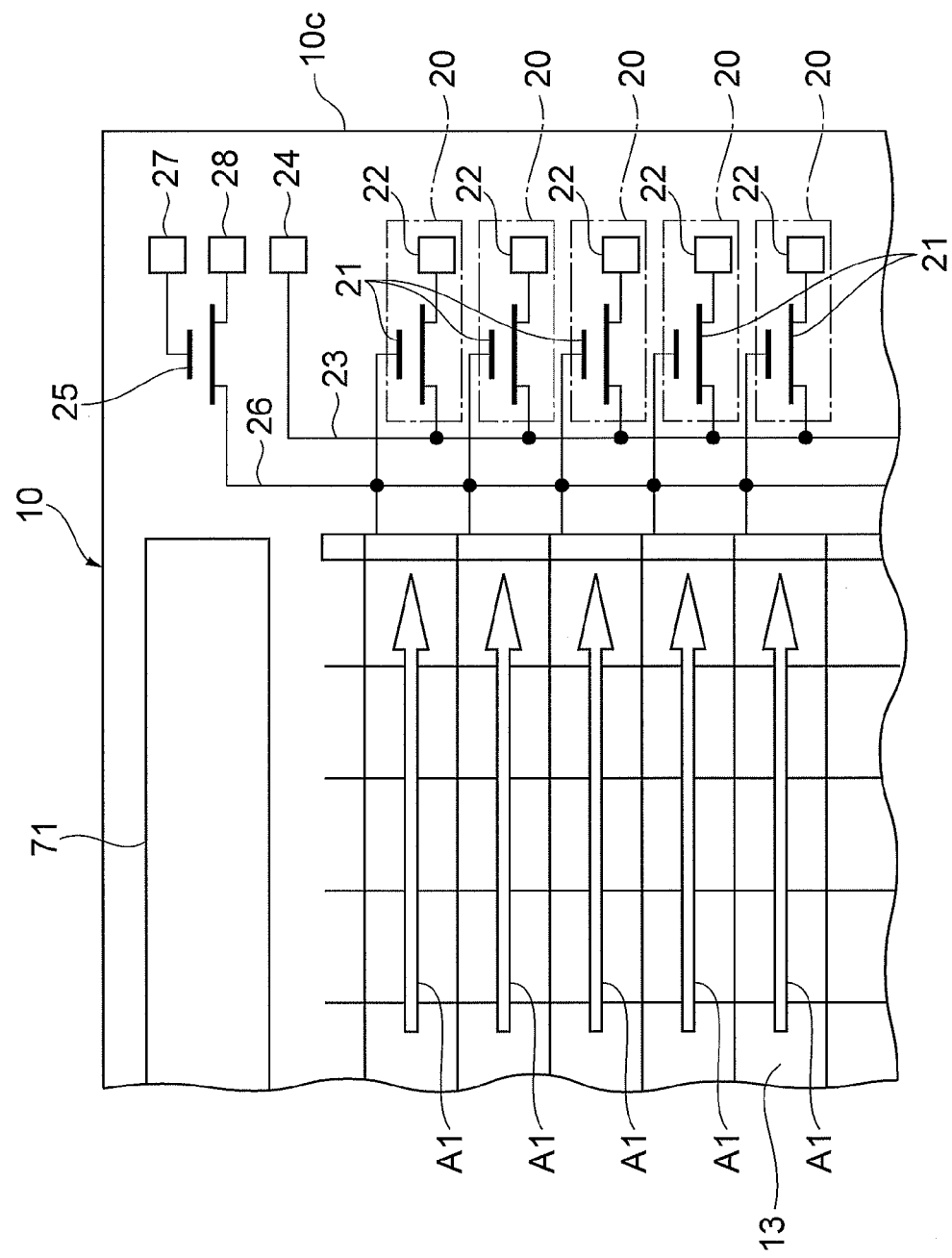
FIG. 4 is a plan view showing a configuration in the vicinity of one end of an imaging plane of the solid-state imaging element.

FIG. 4 is a plan view showing a configuration in the vicinity of the one end 12a of the imaging plane 12 of the solid-state imaging element 10. As previously mentioned, the solid-state imaging element 10 has the drive pad conversion substrates 71, 72 for receiving voltage signals to control charge transfer in the column direction from the transfer control section 40. To the transfer electrodes provided for each of the rows, these voltage signals are applied. The arrow A1 in the figure shows the charge transfer direction in the first operation mode.

Moreover, as previously mentioned, at the one end 12a of the imaging plane 12, N first signal readout circuits 20 are arranged for each of the columns. Each of these first signal readout circuits 20 has a transistor (a FET in the present embodiment) 21 and a signal output bonding pad 22. A control terminal (gate) of the transistor 21 is electrically connected with a terminal end of the one end 12a side of a corresponding pixel column in the imaging plane 12. The potential of this control terminal becomes larger as the amount of a charge taken out of said pixel column increases. One current terminal (drain) of the transistor 21 is electrically connected to a bonding pad 24 via a wiring 23 commonly provided over the N columns. To this bonding pad 24, a voltage of a predetermined magnitude is always applied. The other current terminal (source) of the transistor 21 is electrically connected to the signal output bonding pad 22. In the case of the first operation mode, when a charge is transferred up to the one end 12a in a certain pixel column, a voltage according to the amount of that charge is applied to the control terminal of the transistor 21 of said column. Accordingly, a current of a magnitude according to said amount of charge is output from the other current terminal of said transistor 21 and taken out via the signal output bonding pad 22.

Moreover, the solid-state imaging element 10 further has a transistor (a FET in the present embodiment) 25. The control terminals of the N transistors 21 are electrically connected, via a wiring 26 commonly provided over the N columns, to one current terminal (drain) of the transistor 25. Moreover, a control terminal (gate) and the other current terminal (source) of the transistor 25 are electrically connected to bonding pads 27 and 28, respectively. When each transistor 21 has output a current according to the amount of a transferred charge, a reset voltage is applied via the bonding pad 27 to the control terminal of the transistor 25. Accordingly, a charge accumulated in each column is released from the other current terminal of the transistor 25 via the bonding pad 28, and the control terminal voltage of each transistor 21 is reset.

Figure 5:
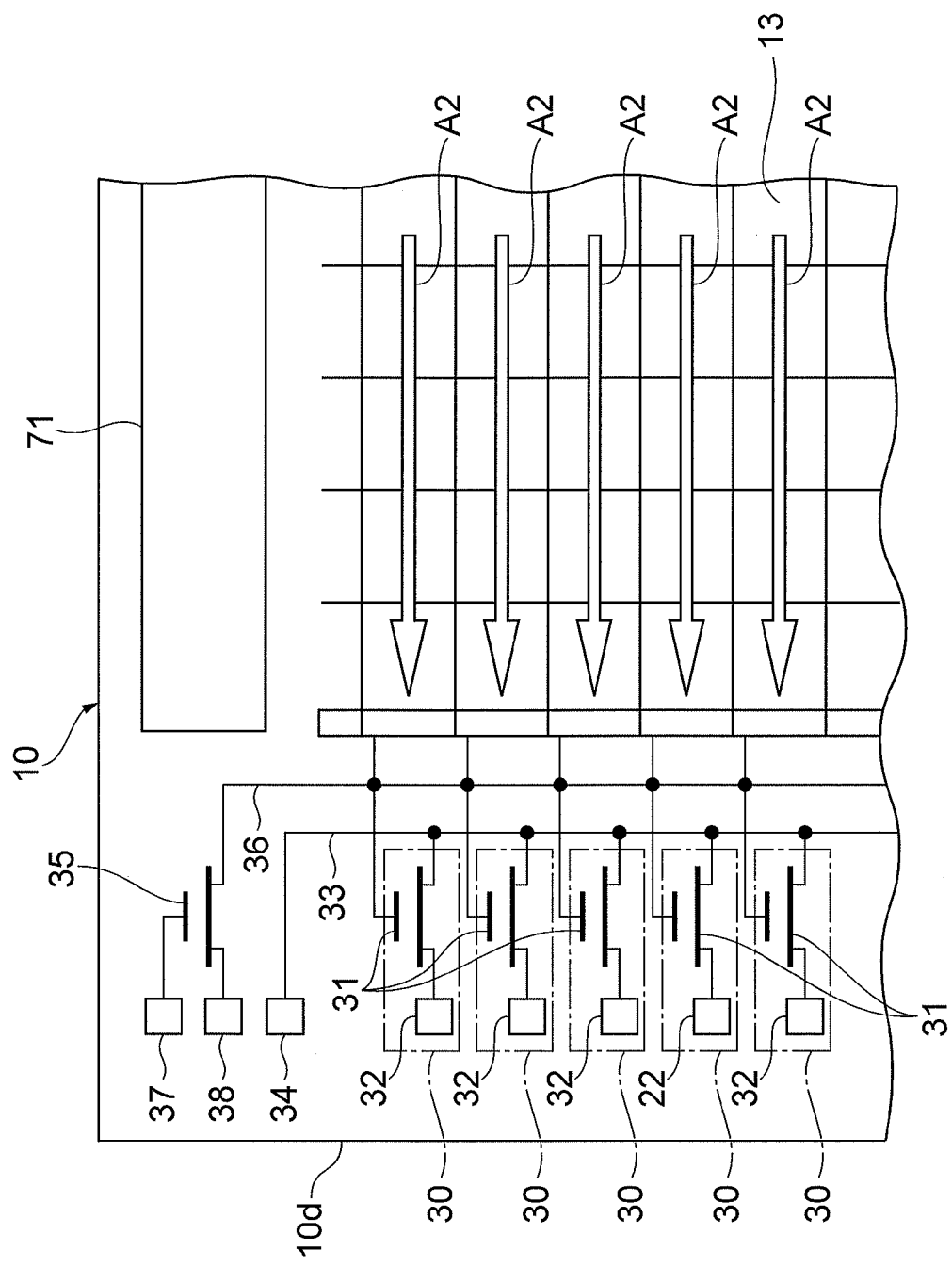
FIG. 5 is a plan view showing a configuration in the vicinity of the other end of an imaging plane of the solid-state imaging element.

FIG. 5 is a plan view showing a configuration in the vicinity of the other end 12b of the imaging plane 12 of the solid-state imaging element 10. The arrow A2 in the figure shows the charge transfer direction in the second operation mode. As previously mentioned, at the other end 12b of the imaging plane 12, N second signal readout circuits 30 are arranged. The circuit configuration of the second signal readout circuit 30 is the same as that of the above-mentioned first signal readout circuits 20 as to be described in the following.

Each of the N second signal readout circuits 30 has a transistor (a FET in the present embodiment) 31 and a signal output bonding pad 32. A control terminal (gate) of the transistor 31 is electrically connected with a terminal end of the other end 12b side of a corresponding pixel column in the imaging plane 12. The potential of this control terminal becomes larger as the amount of a charge taken out of said pixel column increases. One current terminal (drain) of the transistor 31 is electrically connected to a bonding pad 34 via a wiring 33 commonly provided over the N columns. To this bonding pad 34, a voltage of a predetermined magnitude is always applied. The other current terminal (source) of the transistor 31 is electrically connected to the signal output bonding pad 32. In the case of the second operation mode, when a charge is transferred up to the other end 12b in a certain pixel column, a voltage according to the amount of that charge is applied to the control terminal of the transistor 31 of said column. Accordingly, a current of a magnitude according to said amount of charge is output from the other current terminal of said transistor 31 and taken out via the signal output bonding pad 32.

Moreover, the solid-state imaging element 10 further has a transistor (a FET in the present embodiment) 35. The control terminals of the N transistors 31 are electrically connected, via a wiring 36 commonly provided over the N columns, to one current terminal (drain) of the transistor 35. Moreover, a control terminal (gate) and the other current terminal (source) of the transistor 35 are electrically connected to bonding pads 37 and 38, respectively. When each transistor 31 has output a current according to the amount of a transferred charge, a reset voltage is applied via the bonding pad 37 to the control terminal of the transistor 35. Accordingly, a charge accumulated in each column is released from the other current terminal of the transistor 35 via the bonding pad 38, and the control terminal voltage of each transistor 31 is reset.

Figure 6:
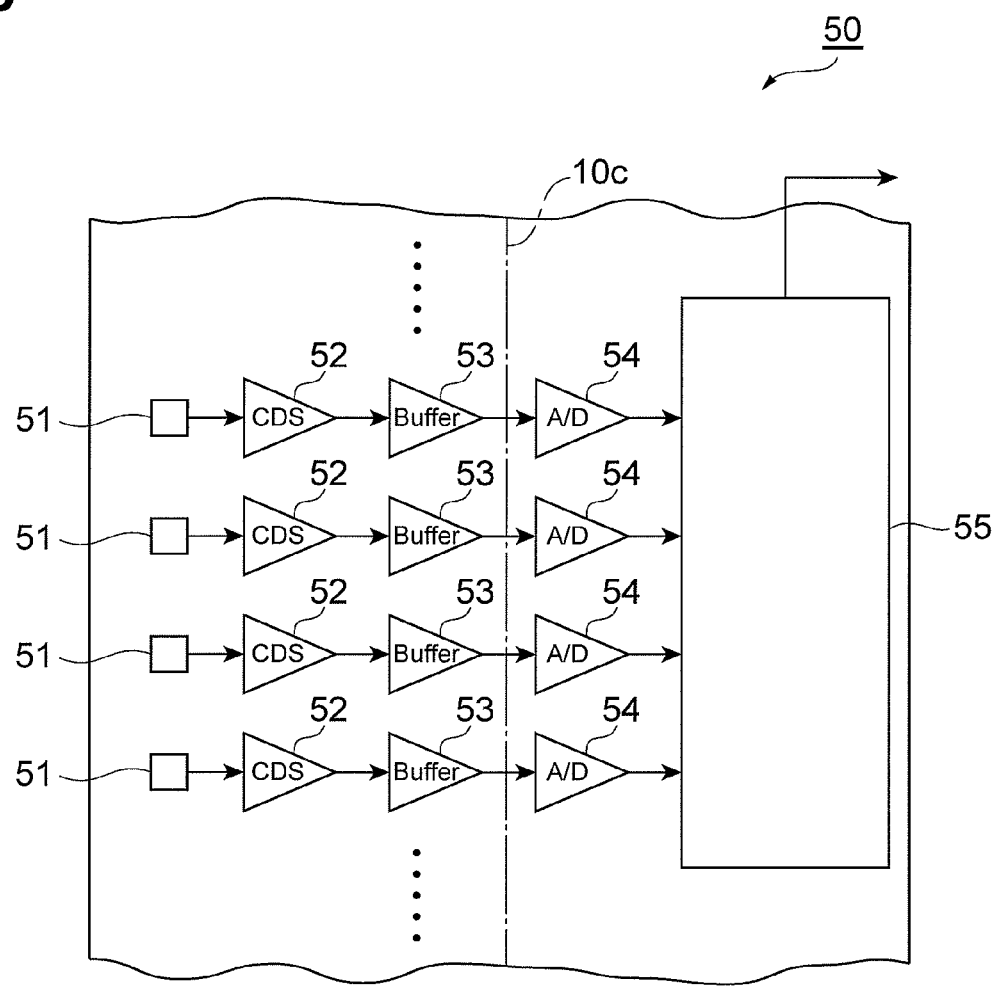
FIG. 6 is a bottom view showing a configuration of a semiconductor element.

FIG. 6 is a bottom view showing a configuration of the semiconductor element 50. The semiconductor element 50 converts electrical signals output from the first signal readout circuits 20 provided in each of the N columns to digital signals, and sequentially outputs the digital signals of the respective columns to the outside of the solid-state imaging device 1A as serial signals. The semiconductor element 50 of the present embodiment has N bonding pads 51, N CDS (Correlated Double Sampling) circuits 52, N buffers 53, and N analog/digital converter circuits 54 provided corresponding to the respective columns, and a multiplexer 55.

Each of the N bonding pads 51 is electrically connected with each of the N signal output bonding pads 22 of the solid-state imaging element 10 via the bump electrode 59 (refer to FIG. 2). Moreover, each of the N CDS circuits 52 is input with an electrical signal output from each of the N first signal readout circuits 20 via the bonding pad 51, and reduces noise of the electrical signal. Examples of the noise to be removed by the CDS circuit 52 include reset noise of FDAs (Floating Diffusion Amplifiers) provided in the respective columns and offset FPN (Fixed Pattern Noise) at dark time. Each of the N buffers 53 is input with an electrical signal output from each of the N CDS circuits 52, and amplifies the electrical signal. Each of the N analog/digital conversion circuits 54 is input with an electrical signal output from each of the N buffers 53, and converts the electrical signal to a digital signal. The multiplexer 55 sequentially outputs digital signals of the respective columns output from the analog/digital converter circuits 54 to the outside of the solid-state imaging device 1A as serial signals. In addition, because variation in the gain of the FDA cannot be removed by the CDS circuit 52, a circuit for performing shading correction at the stage of a digital signal may be further added.

Figure 7:
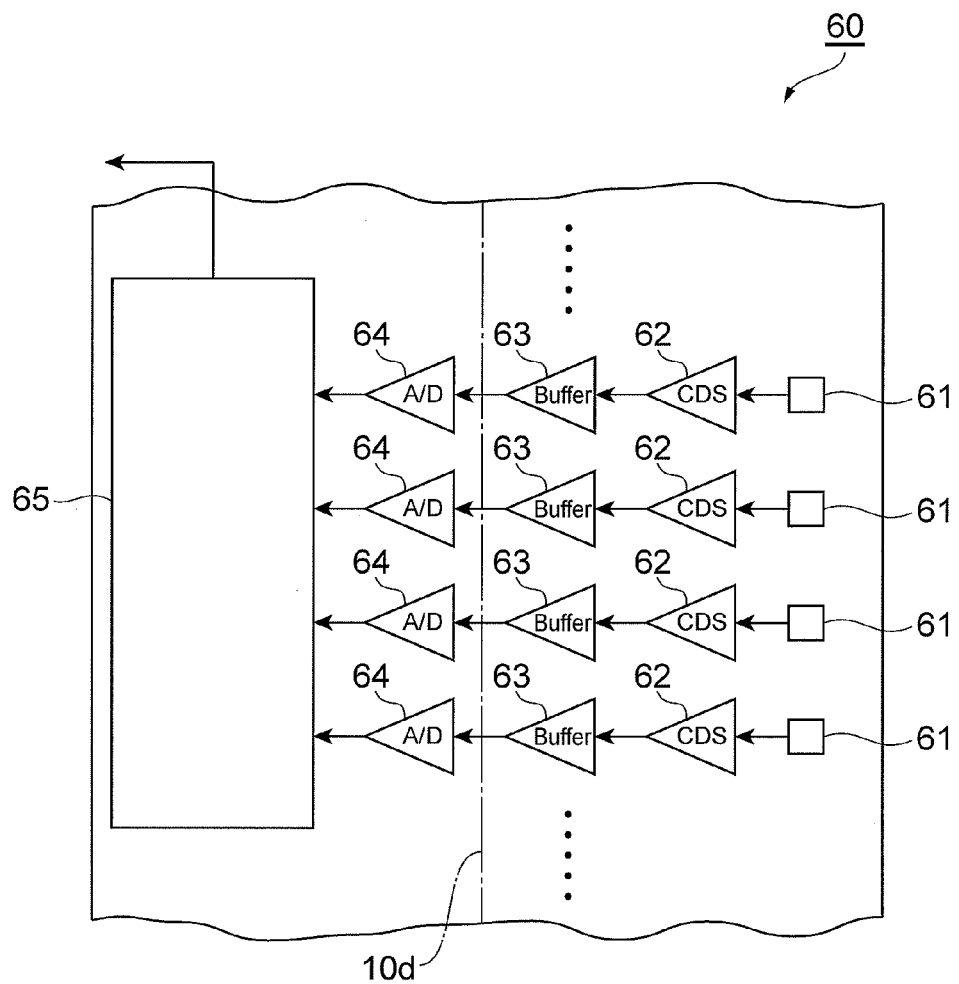
FIG. 7 is a bottom view showing a configuration of a semiconductor element.

FIG. 7 is a bottom view showing a configuration of the semiconductor element 60. The semiconductor element 60 converts electrical signals output from the second signal readout circuits 30 provided in each of the N columns to digital signals, and sequentially outputs the digital signals of the respective columns to the outside of the solid-state imaging device 1A as serial signals. The semiconductor element 60 of the present embodiment has the same configuration as that of the above-mentioned semiconductor element 50. That is, the semiconductor element 60 has N bonding pads 61, N CDS circuits 62, N buffers 63, and N analog/digital converter circuits 64 provided corresponding to the respective columns, and a multiplexer 65.

Each of the N bonding pads 61 is electrically connected with each of the N signal output bonding pads 32 of the solid-state imaging element 10 via the bump electrode 69 (refer to FIG. 2). Moreover, each of the N CDS circuits 62 is input with an electrical signal output from each of the N second signal readout circuits 30 via the bonding pad 61, and reduces noise of the electrical signal. Each of the N buffers 63 is input with an electrical signal output from each of the N CDS circuits 62, and amplifies the electrical signal. Each of the N analog/digital conversion circuits 64 is input with an electrical signal output from each of the N buffers 63, and converts the electrical signal to a digital signal. The multiplexer 65 sequentially outputs digital signals of the respective columns output from the analog/digital converter circuits 64 to the outside of the solid-state imaging device 1A as serial signals.

Here, in FIG. 6 and FIG. 7, end edges 10c and 10d of the solid-state imaging element 10 are shown, respectively. The end edge 10c shown in FIG. 6 is an end edge of the solid-state imaging element 10 on the one end 12a side of the imaging plane 12, and the end edge 10d shown in FIG. 7 is an end edge of the solid-state imaging element 10 on the other end 12b side of the imaging plane 12. As shown in these figures, when viewed in a normal direction of the imaging plane 12, the end edge 10c is located between the buffers 53 and the analog/digital converter circuits 54 of the semiconductor element 50, and the end edge 10d is located between the buffers 63 and the analog/digital converter circuits 64 of the semiconductor element 60. That is, in the present embodiment, the CDS circuits 52, 62 and the buffers 53, 63 are covered with the solid-state imaging element 10 when viewed in the normal direction of the imaging plane 12. Accordingly, the CDS circuits 52, 62 and the buffers 53, 63 can be suitably protected from detection objects including light such as ultraviolet rays, radiation such as X-rays, or electron beams made incident into the solid-state imaging element 10.

In addition, the circuit elements of the semiconductor elements 50, 60 to be covered with the solid-state imaging element 10 can be changed according to necessity. As a result of at least one set of the CDS circuits 52, 62, the buffers 53, 63, the analog/digital converter circuits 54, 64, and the multiplexers 55, 65, said circuit elements can be suitably protected from detection objects.

Figure 8:
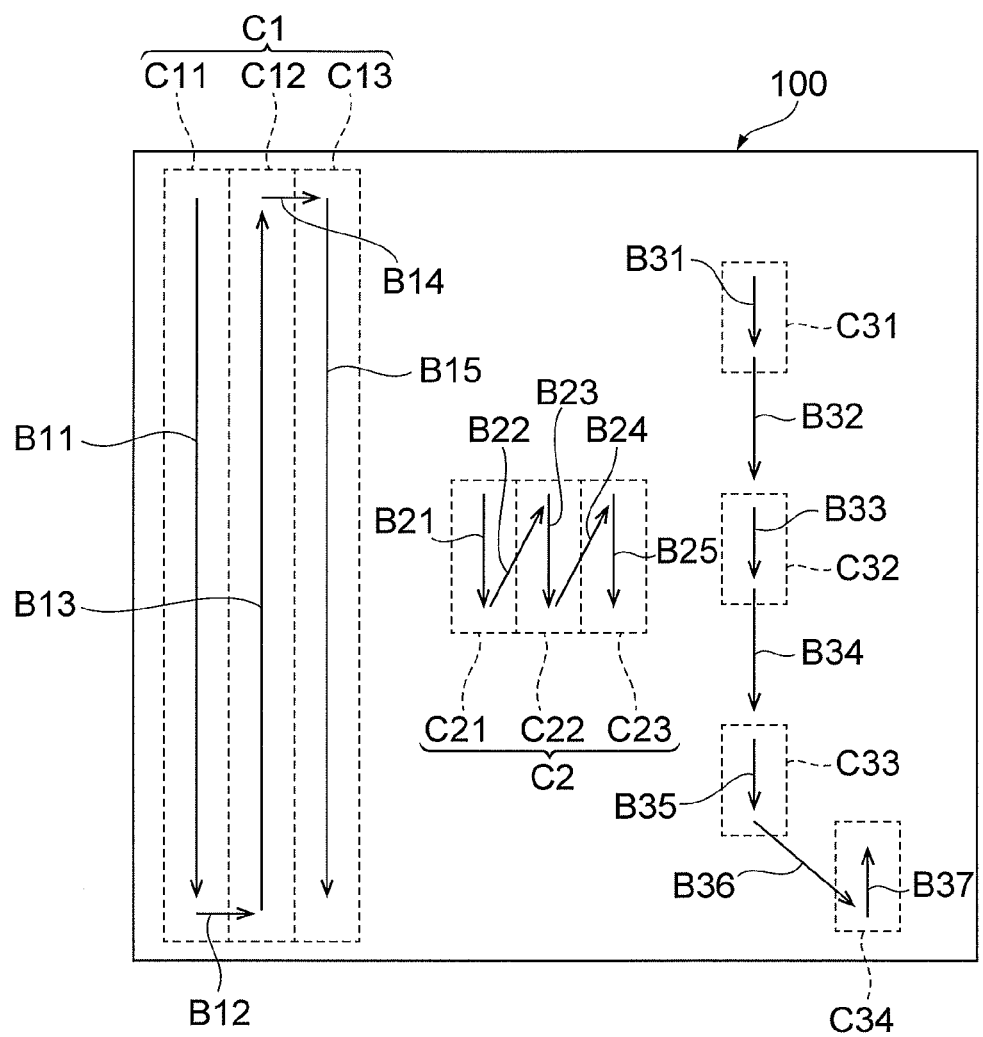
FIG. 8 is a plan view showing a subject to be imaged by the solid-state imaging device.

An example of the operation of the solid-state imaging device 1A with the above configuration will be described. FIG. 8 is a plan view showing a subject 100 to be imaged by the solid-state imaging device 1A. In FIG. 8, an XY orthogonal coordinate system is also shown for convenience of description.

The subject 100 is, for example, a semiconductor wafer formed with a plurality of circuit elements. As previously mentioned, the transfer control section 40 of the solid-state imaging device 1A has the operation mode (first operation mode) for transferring a charge in the direction (arrow A1 shown in FIG. 3) from the other end 12b side to the one end 12a side of the imaging plane 12 in the column direction and the operation mode (second operation mode) for transferring a charge in the direction (arrow A2 shown in FIG. 3) from the one end 12a side to the other end 12b side. Therefore, the following operations can be enabled.

(1) Operation of Reversing Moving Direction while Going on with Imaging an Object Area This is an operation of reversing the relative moving direction with respect to the subject 100 of the imaging plane 12 as shown by arrows B11, B13, and B15 while performing imaging for a target area C1 of FIG. 8. Specifically, the imaging plane 12 is first moved in one direction (negative Y-axis direction), while an area C11 is imaged by a TDI operation (arrow B11). At this time, the transfer control section 40 sets the charge transfer direction of the imaging plane 12 as, for example, the first mode. Image data is output to the outside of the solid-state imaging device 1A from the semiconductor element 50. Next, after the solid-state imaging device 1A is moved in a direction (positive X-axis direction) orthogonal to the above-described direction (arrow B12), the imaging plane 12 is moved in a direction (positive Y-axis direction) opposite to the above-described direction, while an area C12 is imaged by a TDI operation (arrow B13). At this time, the transfer control section 40 sets the charge transfer direction of the imaging plane 12 as, for example, the second mode. Image data is output to the outside of the solid-state imaging device 1A from the semiconductor element 60. Then, after the solid-state imaging device 1A is moved in a direction (positive X-axis direction) orthogonal to the above-described direction (arrow B14), the imaging plane 12 is again moved in the above-described one direction (negative Y-axis direction), while an area C13 is imaged by a TDI operation (arrow B15).

(2) Operation of Going on with Imaging an Object Area with Moving Direction Fixed In the case, such as an object area C2 of FIG. 8, where the object area is longer in the X-axis direction and shorter in the Y-axis direction, it can also be considered to keep the relative moving direction with respect to the subject 100 of the imaging plane 12 fixed as shown by arrows B21, B23, and B25 while performing imaging. Specifically, the imaging plane 12 is first moved in a predetermined direction (negative Y-axis direction), while an area C21 is imaged by a TDI operation (arrow B21). At this time, the transfer control section 40 sets the charge transfer direction of the imaging plane 12 as, for example, the first mode. Image data is output to the outside of the solid-state imaging device 1A from the semiconductor element 50. Next, the solid-state imaging device 1A is moved to one end of a neighboring area C22 (arrow B22), and the imaging plane 12 is again moved in the above-described predetermined direction (negative Y-axis direction), while the area C22 is imaged by a TDI operation (arrow B23). Then, the solid-state imaging device 1A is moved to one end of a neighboring area C23 (arrow B24), and the imaging plane 12 is again moved in the above-described predetermined direction (negative Y-axis direction), while the area C23 is imaged by a TDI operation (arrow B25).

(3) Operation of Imaging a Plurality of Separated Object Areas

In the case of imaging a plurality of separated object areas (for example, critical areas in design) such as object areas C31 to C34 of FIG. 8, imaging may be performed individually for the plurality of object areas C31 to C34, as shown by arrows B31, B33, B35, and B37. Specifically, the imaging plane 12 is moved in an arbitrary direction along the Y-axis (for example, a negative Y-axis direction), while the area C31 is imaged by a TDI operation (arrow B31). Next, after the solid-state imaging device 1A is moved to one end of another object area C32 (arrow B32), the imaging plane 12 is moved in an arbitrary direction along the Y-axis (for example, a negative Y-axis direction), while the area C32 is imaged by a TDI operation (arrow B33). Thereafter, the other regions C33 and C34 are imaged by repeating the same operation (arrows B34 to B37).

Effects to be obtained by the solid-state imaging device 1A according to the present embodiment described above will be described. By the solid-state imaging device 1A of the present embodiment, by arranging output ports (terminal end pixels) of the respective columns of the solid-state imaging element 10 and the signal readout circuits 20, 30 close to each other on a common substrate and providing N input ports (input ends) in the signal readout circuits 20, 30, high-speed and low-noise readout can be realized. For example, in the present embodiment, the signal readout circuits 20, 30 are arranged for each of the columns. Accordingly, signals can be simultaneously read out of all columns, so that, for example, in the case of reading out of 2000 columns by a row clock of 30 MHz, this can be operated at 30 MHz/2000=15 kHz. Therefore, noise can be reduced to a level of one fortieth. Alternatively, when noise up to the same extent as conventionally can be allowed, higher-speed readout is enabled.

Figure 9:
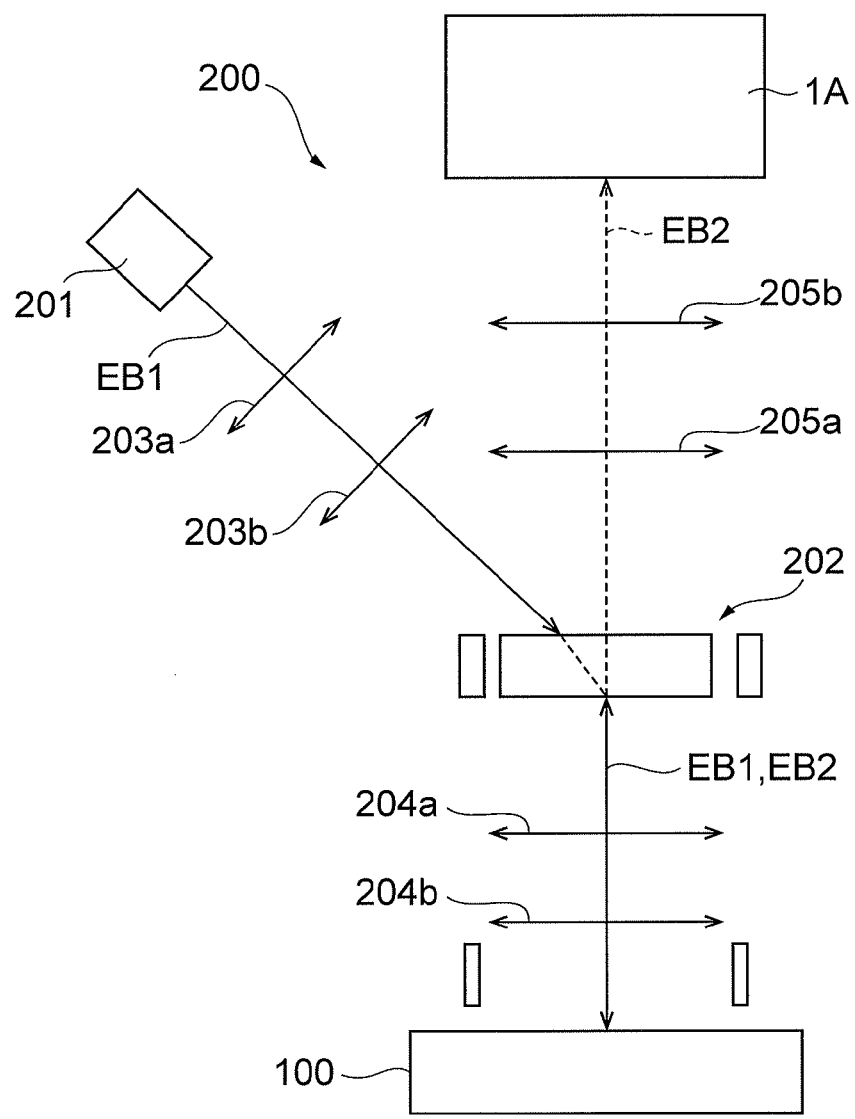
FIG. 9 is a view schematically showing a configuration example of an inspection system including a solid-state imaging device that performs the operation shown in FIG. 8.

Here, FIG. 9 is a view schematically showing a configuration example of an inspection system 200 including a solid-state imaging device 1A that performs the operation shown in FIG. 8. This inspection system 200 includes an electron gun 201, an ExB filter 202, and the solid-state imaging device 1A. An electron beam EB1 emitted from the electron gun 201 is reduced by lenses 203a and 203b, and then focused onto a deflection center plane of the ExB filter 202. The electron beam EB1 deflected by the ExB filter 202 is converged by lenses 204a and 204b, and irradiated onto the subject 100 (semiconductor wafer). Then, secondary electrons EB2 containing pattern image information of the subject 100 are emitted from the subject 100. The secondary electrons EB2 are enlarged by four stages of lenses 204a, 204b and 205a, 205b, and then made incident into the imaging plane 12 of the solid-state imaging device 1A.

Here, for example, when the magnifying power of the lenses 204a, 204b and 205a, 205b is 500 times, the width in the column direction of the imaging plane 12 is, for example, 12 μm, and the width in the row direction is, for example, 12 μm, a considerably small area such as 24 nm×24 nm in the subject 100 can be imaged with a high spatial resolution. However, when the subject 100 is large such as, for example, a 12-inch wafer, it requires a long time to image such a small area. By the solid-state imaging device 1A of the present embodiment, even in such a case, high-speed and low-noise imaging is enabled by combining the solid-state imaging element 10 and the signal readout circuits 20, 30, and imaging with a high resolution and in a short time is enabled in a TDI operation.

Moreover, in the solid-state imaging device 1A, the CCD-type solid-state imaging element 10 has the first and second signal readout circuits 20, 30 arranged at each of one and the other ends in the column direction thereof, and further, to each of these signal readout circuits 20, 30, each of the first and second semiconductor elements 50, 60 for serial signal outputs is connected. By such a configuration, in the case of performing a TDI operation in a direction from the other end side to one end side, it suffices to transfer a charge in that direction, and convert the charge into a serial signal output by the first signal readout circuit 20 and the first semiconductor element 50. Moreover, in the case of performing a TDI operation in a direction from one end side to the other end side, it suffices to transfer a charge in that direction, and convert the charge into a serial signal output by the second signal readout circuit 30 and the second semiconductor element 60. Thus, by the solid-state imaging device 1A of the present embodiment, the CCD charge transfer direction can be reversed. Therefore, when performing imaging by a TDI operation, a movement of the solid-state imaging device 1A can be reduced, so that the time required for imaging can be shortened.

As above, preferred embodiments of the present invention have been described in detail, but the present invention is not limited to the above-described embodiments, and various modifications can be made.

By the solid-state imaging device according to the present invention, when performing imaging by a TDI operation, the time required for imaging can be shortened.

What is claimed is:

1. A solid-state imaging device comprising:
a CCD-type solid-state imaging element having an imaging plane formed of M×N (M and N are integers not less than 2) pixels that are two-dimensionally arrayed in M rows and N columns, N first signal readout circuits arranged on one end side in the column direction for each of the columns with respect to the imaging plane and for outputting electrical signals according to magnitudes of charges taken out of the respective columns, respectively, and N second signal readout circuits arranged on the other end side in the column direction for each of the columns with respect to the imaging plane and for outputting electrical signals according to magnitudes of charges taken out of the respective columns, respectively;

a first semiconductor element for converting electrical signals output from the first signal readout circuits for each of the columns to digital signals, and sequentially outputting the digital signals of the respective columns as serial signals;

a second semiconductor element for converting electrical signals output from the second signal readout circuits for each of the columns to digital signals, and sequentially outputting the digital signals of the respective columns as serial signals; and a transfer control section configured to control a charge transfer along the column direction of the imaging plane, the transfer control section has a first operation mode for transferring a charge in a first direction from the other end side to the one end side, and a second operation mode for transferring a charge in a second direction from the one end side to the other end side, the transfer control configured to select a transfer speed and a transfer direction of a charge coincident with a moving speed and a moving direction of a moving subject that is being captured by the CCD-type solid-state imaging element, the transfer control section sets the charge transfer direction of the imaging plane as the first operation mode when the moving subject relatively moves in the first direction with respect to the imaging plane, and sets the charge transfer direction of the imaging plane as the second operation mode when the moving subject relatively moves in the second direction with respect to the imaging plane, wherein the imaging plane, the N first signal readout circuits, and the N second signal readout circuits are formed on a main surface of the CCD-type solid-state imaging element, the first semiconductor element is mounted on the main surface of the CCD-type solid-state imaging element along the one end side so as to cover the one end side when viewed from a direction perpendicular towards the main surface, the second semiconductor element is mounted on the main surface of the CCD-type solid-state imaging element along the other end side so as to cover the other end side when viewed from the direction perpendicular towards the main surface, the first semiconductor element having N first bonding pads that are electrically connected with corresponding N first signal output bonding pads of the N first signal readout circuits, the N first bonding pads facing and arranged with the corresponding one of the N first signal output bonding pads in the direction perpendicular towards the main surface, the second semiconductor element having N second bonding pads that are electrically connected with corresponding N second signal output bonding pads of the N second signal readout circuits, the N second bonding pads facing and arranged with the corresponding one of the N second signal output bonding pads in the direction perpendicular towards the main surface.

2. The solid-state imaging device according to claim 1, wherein
each of the first and second semiconductor elements includes:
a correlated double sampling circuit for reducing noise of electrical signals output for each of the columns from each of the N first and second signal readout circuits;
a buffer for amplifying a signal output from the correlated double sampling circuit;
an analog/digital converter circuit for converting a signal output from the buffer to a digital signal; and
a multiplexer for sequentially outputting the digital signals of the respective columns output from the analog/digital converter circuit as serial signals.

3. A method performed on a solid-state imaging device, the solid state imaging device including,
a CCD-type solid-state imaging element having an imaging plane formed of M×N (M and N are integers not less than 2) pixels that are two-dimensionally arrayed in M rows and N columns, N first signal readout circuits arranged on one end side in the column direction for each of the columns with respect to the imaging plane and for outputting electrical signals according to magnitudes of charges taken out of the respective columns, respectively, and N second signal readout circuits arranged on the other end side in the column direction for each of the columns with respect to the imaging plane and for outputting electrical signals according to magnitudes of charges taken out of the respective columns, respectively;
a first semiconductor element for converting electrical signals output from the first signal readout circuits for each of the columns to digital signals, and sequentially outputting the digital signals of the respective columns as serial signals;
a second semiconductor element for converting electrical signals output from the second signal readout circuits for each of the columns to digital signals, and sequentially outputting the digital signals of the respective columns as serial signals; and
a transfer control section for controlling charge transfer along the column direction of the imaging plane,
the method including the steps of:
capturing a moving subject with the CCD-type solid-state imaging element, the moving subject having a moving speed and a moving direction relative to the CCD-type solid-state imaging element;
selecting a transfer speed and a transfer direction of a charge coincident with the moving speed and the moving direction of the moving subject;
performing a first operation mode with the transfer control section for transferring a charge in a first direction from the other end side to the one end side, by setting the charge transfer direction of the imaging plane as the first operation mode when the moving subject relatively moves in the first direction with respect to the imaging plane; and
performing a second operation mode with the transfer control section for transferring a charge in a second direction from the one end side to the other end side, by setting the charge transfer direction of the imaging plane as the second operation mode when the moving subject relatively moves in the second direction with respect to the imaging plane.

* * * * *